(12) United States Patent
Fujita (10) Patent No.: US 8,373,405 B2
(45) Date of Patent: Feb. 12, 2013

(54) POWER SUPPLY VOLTAGE DETECTION CIRCUIT

(75) Inventor: Yuji Fujita, Ohtsu (JP)

(73) Assignee: Renesas Electronics Corporation, Kanagawa (JP)

( * ) Notice: Subject to any disclaimer, the term of this patent is extended or adjusted under 35 U.S.C. 154(b) by 266 days.

(21) Appl. No.: 12/729,824

(22) Filed: Mar. 23, 2010

(65) Prior Publication Data

US 2010/0244805 A1      Sep. 30, 2010

(30) Foreign Application Priority Data

Mar. 24, 2009   (JP) .................................. 2009-072036

(51) Int. Cl.
  *G05F 3/16*   (2006.01)
  *G05F 5/00*   (2006.01)
(52) U.S. Cl. ........................... 323/317; 323/299; 361/92
(58) Field of Classification Search .................. 323/282, 323/289, 299, 315, 317
  See application file for complete search history.

(56) References Cited

U.S. PATENT DOCUMENTS

| | | | | |
|---|---|---|---|---|
| 4,970,620 A | * | 11/1990 | Lehnhoff et al. | ............... 361/18 |
| 5,646,514 A | * | 7/1997 | Tsunetsugu | ................... 323/288 |
| 7,274,226 B2 | | 9/2007 | Yoshizawa | |
| 2005/0218969 A1 | | 10/2005 | Yoshizawa | |

FOREIGN PATENT DOCUMENTS

| | | |
|---|---|---|
| JP | 2005-278056 A | 10/2005 |
| JP | 2005291865 A | 10/2005 |
| JP | 2007-258530 A | 10/2007 |

OTHER PUBLICATIONS

Office Action dated Oct. 16, 2012 issued by the Japanese Patent Office in counterpart Japanese Application No. 2009-072036.

* cited by examiner

*Primary Examiner* — Gary L Laxton
(74) *Attorney, Agent, or Firm* — Sughrue Mion, PLLC (57) ABSTRACT

A power supply voltage detection circuit of the present invention includes a reference signal generation circuit that generates a reference signal according to a power supply voltage, a first transistor having a current flowing between a first terminal and a second terminal, where the current is controlled according to the reference signal, a voltage generation circuit that generates a control voltage according to a potential difference between the power supply voltage and the first terminal of the first transistor, and a second transistor that controls whether or not to output the power supply voltage according to the control voltage. Such circuit configuration enables to accurately detect a low voltage state of the power supply voltage.

9 Claims, 9 Drawing Sheets

POWER SUPPLY VOLTAGE (VCC)

POWER SUPPLY VOLTAGE DETECTION CIRCUIT

INCORPORATION BY REFERENCE

This application is based upon and claims the benefit of priority from Japanese patent application No. 2009-072036, filed on Mar. 24, 2009, the disclosure of which is incorporated herein in its entirety by reference.

BACKGROUND

1. Field of the Invention

The present invention relates to a power supply voltage detection circuit.

2. Description of Related Art

The operation of an electronic circuit, which operates mainly with a direct current, is not stable at low voltage until a power supply voltage reaches the operation guaranteed range. Thus, the output of the electronic circuit is indefinite at low voltage. Then an excessive current flows into the electronic circuit or a device connected to a subsequent stage. Therefore, a failure such as a destruction of these circuits occurs at worst. In order to avoid such failure, an electronic circuit usually has a power supply voltage detection circuit mounted therein. The power supply voltage detection circuit outputs a control signal at low voltage so as not to operate the electronic circuit. This method is generally called UVLO (Under Voltage Lock Out).

Figure 7:
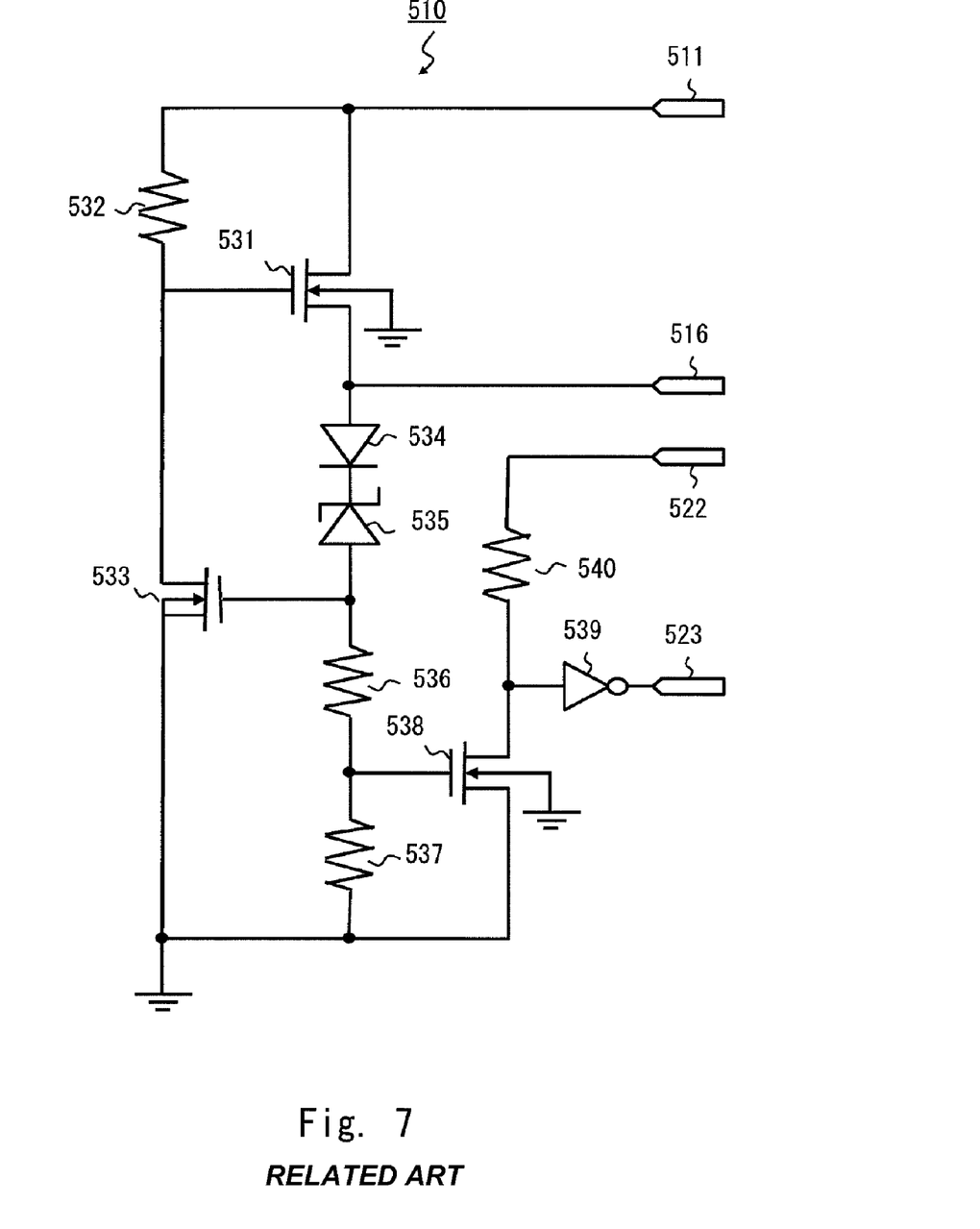
FIG. 7 is a circuit diagram illustrating a power supply voltage detection circuit according to a related art.

Japanese Unexamined Patent Application Publication No. 2007-258530 discloses the technique concerning such power supply voltage detection circuit. FIG. 7 illustrates a low voltage detection circuit (power supply voltage detection circuit) disclosed in Japanese Unexamined Patent Application Publication No. 2007-258530. A low voltage detection circuit 510 illustrated in FIG. 7 is provided with N-channel MOS transistors 531, 533, and 538, resistors 532, 536, 537, and 540, a diode 534, a Zener diode 535, and an inverter 539.

In FIG. 7, an input terminal 511 supplied with an input voltage (power supply voltage VDD) is connected to a drain of the N-channel MOS transistor 531 and one terminal of the resistor 532. The other terminal of the resistor 532 is connected to a gate of the N-channel MOS transistor 531 and a drain of the N-channel MOS transistor 533. A source of the N-channel MOS transistor 533 is grounded. A source of the N-channel MOS transistor 531 is connected to an internal power supply terminal, an auxiliary power supply terminal 516, and an anode side of the diode 534. A cathode side of the diode 534 is connected to a cathode side of the Zener diode 535. An anode side of the Zener diode 535 is connected to a gate of the N-channel MOS transistor 533. An anode side of the Zener diode 535 is grounded via the resistors 536 and 537.

A gate of the N-channel MOS transistor 538 is connected to a junction of the resistors 536 and 537. A source of the N-channel MOS transistor 538 is grounded. Then, a drain of the N-channel MOS transistor 538 is connected to the low voltage detection terminal 523 via the inverter 539. The drain of the N-channel MOS transistor 538 is also connected to a reference voltage terminal 522, which is supplied with the reference voltage via the resistor 540.

First, a case in which the input voltage VDD is low at the time of power on is explained. In this case, a voltage is applied to the gate of the N-channel MOS transistor 531 via the resistor 532. However, this voltage does not reach a threshold voltage Vth1 of the N-channel MOS transistor 531. Thus, the N-channel MOS transistor 531 is turned off. Therefore, the internal power supply voltage 516 indicates 0V. At this time, the gate of the N-channel MOS transistor 538 is also 0V. Accordingly, the N-channel MOS transistor 538 is turned off. Therefore, the voltage by the side of the input terminal of the inverter 539 indicates the reference voltage via the resistor 540. Then, a signal of 0V is output outside from the low voltage detection terminal 523.

Next, a case in which the input voltage VDD further increases is explained. In this case, a voltage more than or equal to the threshold voltage Vth1 is applied to the gate of the N-channel MOS transistor 531 via the resistor 532. Then, the N-channel MOS transistor 531 is turned on. At this time, the internal electrical power supply voltage 516 indicates a voltage, which is the input voltage VDD subtracted by the threshold voltage Vth of the N-channel MOS transistor 531. On the other hand, a gate voltage of the N-channel MOS transistor 538 does not reach a threshold voltage Vth2 by a forward drop voltage VF of the diode 534, a voltage drop by a Zener voltage VZ of the Zener diode 535, and resistors 536 and 537. Then, the N-channel MOS transistor 538 is turned off. Therefore, the voltage by the side of the input terminal of the inverter 539 indicates the reference voltage via resistor 540. Then, a signal of 0V is output from the low voltage detection terminal 523.

Next, a case in which the input voltage VDD further increases is explained. In this case, the gate voltage of the N-channel MOS transistor 538 increases. Then, the N-channel MOS transistor 538 is turned on. Thus, the reference voltage is discharged via the resistor 540 and the N-channel MOS transistor 538. That is, the voltage by the side of the input terminal of the inverter 539 indicates 0V. Then, a high-level signal is output outside from the low voltage detection terminal 523. That is, a signal of the same voltage as the reference voltage is output outside from the low voltage detection terminal 523. The N-channel MOS transistor 533 is to stable the voltage of the internal power supply voltage 516 until the auxiliary power supply voltage 516 rises. As the N-channel MOS transistor 533 is not concerned with the operation of the low voltage detection signal, the explanation is omitted.

Figure 8:
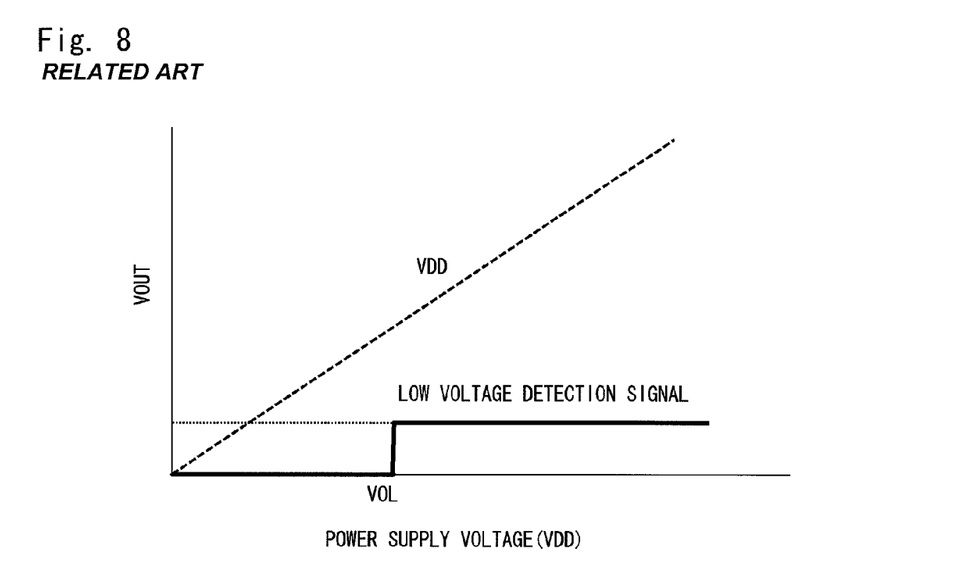
FIG. 8 illustrates an operation waveform of the power supply voltage detection circuit according to the related art.

FIG. 8 illustrates the relationship between the input voltage VDD and the output voltage. As illustrated in FIG. 8, based on a predetermined voltage value of the input voltage VDD (hereinafter referred to as a detection voltage VOL), the circuit of FIG. 7 outputs a low voltage detection signal of 0V (L level) when the input voltage VDD is lower than the detection voltage VOL, and outputs a low voltage detection signal of the same voltage (H level) as the reference voltage when the input voltage VDD is higher than detection voltage VOL. Thus, the circuit illustrated in FIG. 7 can force to stop the operation of an electronic circuit by the low voltage detection signal, in case of the input voltage VDD with unstable operation.

In order for the low voltage detection circuit illustrated in FIG. 7 to output the low voltage detection signal correctly, the reference voltage needs to be operating normally. However, a circuit for generating the reference voltage (not illustrated and hereinafter referred to as a reference voltage generation circuit) usually generates the reference voltage according to the input voltage VDD. Therefore, the operation of the reference voltage generation circuit is unstable until the input voltage VDD reaches the predetermined voltage. Thus, it is difficult for the low voltage detection circuit illustrated in FIG. 7 to output the low voltage detection signal correctly.

Figure 9:
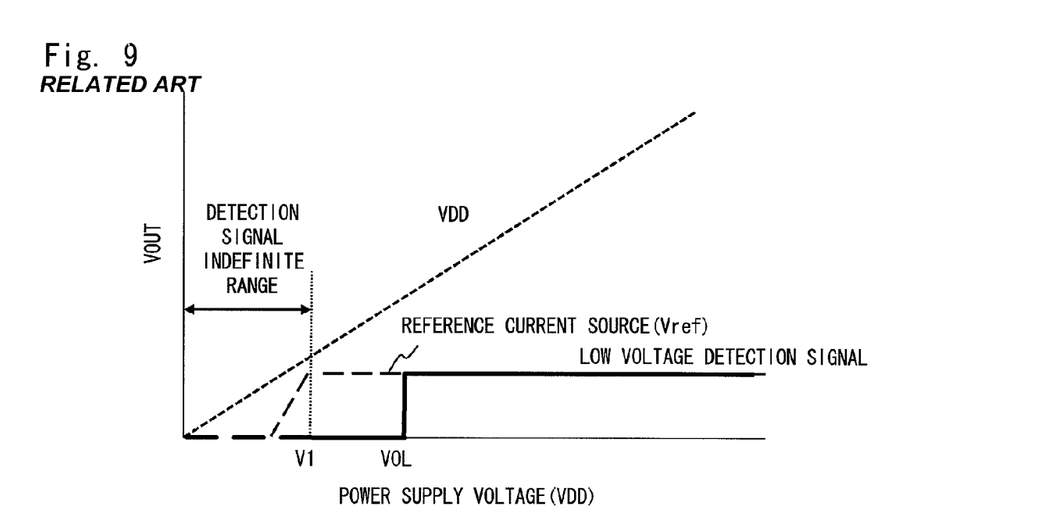
FIG. 9 illustrates an operation waveform of the power supply voltage detection circuit according to the related art.

An example of such a problem is illustrated in FIG. 9. Note that the input voltage VDD that is required in order for the reference voltage generation circuit to generate the reference voltage Vref shall be V1. That is, if the input voltage VDD is less than or equal to V1, the operation of the reference voltage generation circuit is unstable. In other words, if the input voltage VDD is less than or equal to V1, the reference voltage generation circuit does not output a normal reference voltage (the detection signal indefinite range of FIG. 9). In this case, the low voltage detection signal output by the low voltage detection circuit is indefinite.

The reason that the low voltage detection signal is indefinite is explained hereinafter. As mentioned above, if the input voltage VDD is low, which is less than or equal to V1, the voltage by the input terminal side of the inverter 539 indicates the reference voltage Vref via the resistor 540. However, at low voltage, the correct reference voltage Vref is not supplied from the reference voltage generation circuit, which is provided externally, to the reference voltage terminal 522. Then the voltage by the side of the input terminal of the inverter 539 is indefinite. Therefore, the low voltage detection signal output by the low voltage detection circuit does not operate normally, either.

Especially, even if the input voltage VDD rises relatively quickly at a power on, it often takes time for the reference voltage generation circuit to operate normally. That is, even if the input voltage VDD indicates more than or equal to the detection voltage VOL, the reference voltage generation circuit may not output a normal reference voltage Vref. In this case, there is a problem that the low voltage detection signal does not operate normally until the reference voltage Vref is stabilized.

Figure 10:
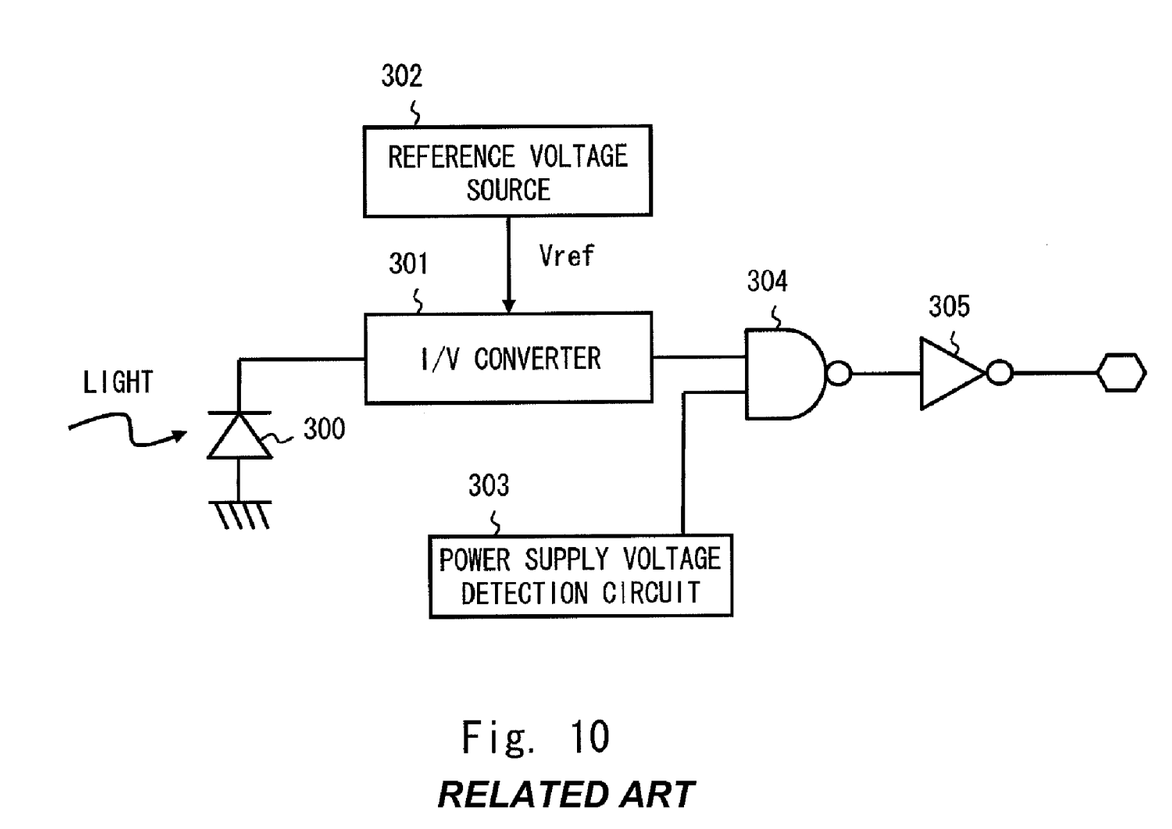
FIG. 10 is a block diagram illustrating a photocurrent-to-voltage conversion circuit provided with the power supply voltage detection circuit according to the related art.

This problem is explained using an actual electronic circuit. FIG. 10 illustrates a photocurrent-to-voltage conversion circuit used as a receiver circuit of a photocoupler. The circuit illustrated in FIG. 10 is used to electrically isolate between an input and an output of a FA (Factory Automation) related servo control apparatus etc. For example, a light-emitting device of the input side (a light-emitting diode, for example, which is not illustrated in FIG. 10) emits light to a light-receiving device of the output side when an electric signal is supplied. At this time, a current corresponding to the received light flows into the light-receiving device (photodiode, for example). Then, the circuit illustrated in FIG. 10 converts the photocurrent flowing into the light-receiving device (photodiode, for example) into a voltage and outputs it. As for such a photocoupler, a voltage level of the output signal is determined according to whether the light-emitting diode emits light or not. For example, if the light emitting diode emits light, the output voltage V0 indicates a high-level. On the other hand, if the light emitting diode does not emit light, the output voltage V0 indicates a low-level (0V).

The photocurrent-to-voltage conversion circuit illustrated in FIG. 10 is provided with a photodiode 300 for receiving light and generating a photocurrent, and an I/V converter 301 for converting the photocurrent into a voltage. The circuit illustrated in FIG. 10 is further provided with a power supply voltage detection circuit 303 as the one in FIG. 7, a reference voltage source 302, a NAND circuit 304, and an inverter 305. The I/V converter 301 is driven by the reference voltage Vref generated by the reference voltage source 302. The I/V converter 301 converts the current flowing in the photodiode 300 into a voltage, and outputs it to one of the input terminal of the NAND circuit 304. The power supply voltage detection circuit 303 outputs the low voltage detection signal to another input terminal of the NAND circuit 304. The NAND circuit 304 outputs the output voltage V0 outside via the INV circuit 305. Although not illustrated, the power supply voltage detection circuit 303 is driven by the reference voltage Vref.

If the power supply voltage VDD is lower than the detection voltage VOL, the power supply voltage detection circuit 303 outputs the low-level low voltage detection signal, for example. Then, the output signal of the I/V converter 301 is not propagated as the output voltage V0 of the photocurrent-to-voltage conversion circuit. That is, the output voltage V0 of the photocurrent-to-voltage conversion circuit is forced to indicate a low-level (0V). On the other hand, if the power supply voltage VDD is higher than the detection voltage VOL, the power supply voltage detection circuit 303 outputs a high-level low voltage detection signal, for example. Then, the output signal of the I/V converter 301 is propagated as an output voltage V0 of the photocurrent-to-voltage conversion circuit. That is, the photocurrent-to-voltage conversion circuit can output the output voltage V0 according to the input light.

Figure 11A:
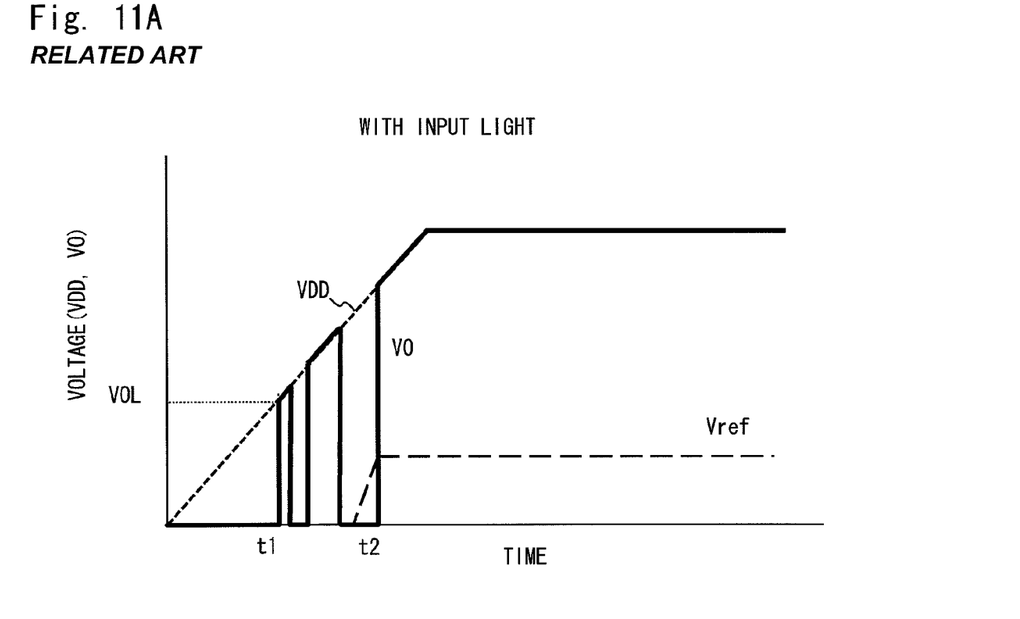
FIG. 11A is a block diagram illustrating the photocurrent-to-voltage conversion circuit provided with the power supply voltage detection circuit according to a related art.
Figure 11B:
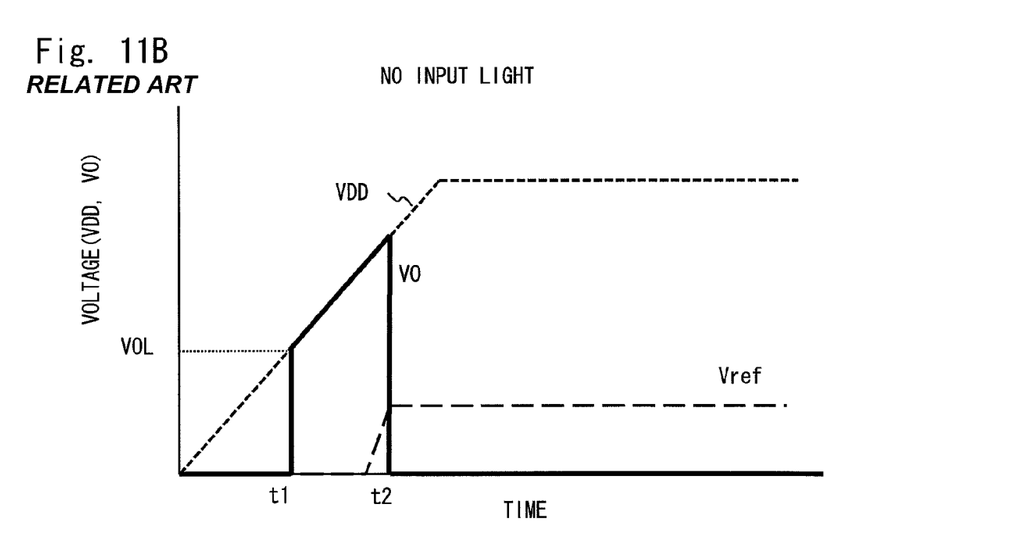
FIG. 11B is a block diagram illustrating a photocurrent-to-voltage conversion circuit provided with the power supply voltage detection circuit according to the related art.

An example in case the power supply voltage VDD rises relatively quickly at a power on is illustrated in FIGS. 11A and 11B. As the power supply voltage VDD rises relatively quickly, the reference voltage Vref is stabilized (rises) after the power supply voltage VDD reaches the detection voltage VOL. Note that the horizontal axis indicates time passed since the power on. The vertical axis indicates the voltage. As illustrated in FIGS. 11A and 11B, the reference voltage Vref is not stabilized (has not risen) even at the time when the power supply voltage VDD indicates the detection voltage (t1). Accordingly, the output voltage V0 is not stabilized until the reference voltage Vref is stabilized (from t1 to t2).

For example, as illustrated in FIG. 11A, if light is input to the photodiode 300, the power supply voltage VDD is less than or equal to the detection voltage VOL till the time t1. Then the output voltage V0 indicates a low-level (0V). However, the reference voltage Vref is not stabilized even after the time t1. Therefore, the I/V converter 301 does not operate normally. Further, as the reference voltage Vref is unstable, the low voltage detection signal output from the power supply voltage detection circuit 303 not stabilized either, as described above. Accordingly, the output voltage V0 repeats high-level and low-level until the reference voltage Vref is stabilized (from t1 to t2). That is, so-called "ringing" occurs.

On the other hand, as illustrated in FIG. 11B, even if there is no light input to the photodiode 300, the reference voltage Vref is unstable from the time t1 to t2, thus the I/V converter 301 doesn't operate normally. Further, as the reference voltage Vref is unstable, the low voltage detection signal output from the power supply voltage detection circuit 303 is not stabilized either, as described above. Accordingly, there is a problem such that the output voltage V0 indicates a different signal (for example a high-level signal) from an actual output logic.

Figure 12:
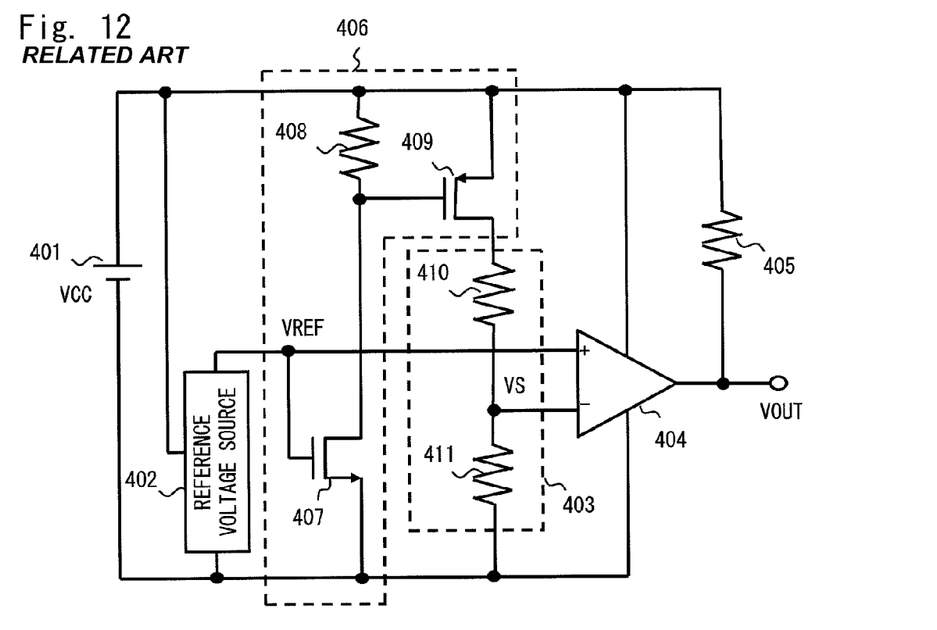
FIG. 12 is a circuit diagram illustrating a power supply voltage detection circuit according to a related art.

A solution to such problem is disclosed in Japanese Unexamined Patent Application Publication No. 2005-278056. FIG. 12 illustrates a power supply voltage drop detection circuit (power supply voltage detection circuit) disclosed in Japanese Unexamined Patent Application Publication No. 2005-278056. The circuit illustrated in FIG. 12 is provided with a reference voltage source 402, switches 407 and 409, a voltage divider 403, a resistor 408, and a comparator 404. The voltage divider 403 includes resistors 410, 411. The switches 407 and 409, and the resistor 408 constitute a switching circuit 406. The reference voltage source 402 generates a reference voltage VREF. The switch 407 is controlled to be on and off by the reference voltage VREF. The switch 409 is controlled to be on and off by the on/off state of the switch 407 and the power supply voltage VCC. The voltage divider 403 divides the power supply voltage VCC supplied via the switch 409, and outputs it as an output voltage VS. The comparator 404 compares the reference voltage VREF with the output voltage VS, and outputs a comparison result. Note that the switch 407 is an N-channel MOS transistor, and the switch 409 is a P-channel MOS transistor.

First, a case in which the power supply voltage VCC is low is explained. In this case, the reference voltage VREF output by the reference voltage source 402 is low (approximately 0V). That is, the voltage applied to a control terminal (gate) of the switch 407 has not reached the threshold voltage. Accordingly, both the switches 407 and 409 are turned off. As a result, the output voltage VS of the voltage divider 403 indicates 0V. Thus, the output voltage VOUT of the comparator 404 indicates a high-level, that is, the power supply voltage VCC.

Next, a case in which the reference voltage VREF begins to increase by the increase of power supply voltage VCC is explained. In this case, both the switches 407 and 409 are turned on. As a result, the power supply voltage VCC is applied to the voltage divider 403. However, since the output voltage VS is low compared with the reference voltage VREF, the output voltage VOUT of the comparator 404 indicates a high-level (VCC). However, if the power supply voltage VCC further increases, the output voltage VS also increases along with that. Then, if the output voltage VS becomes higher than the reference voltage VREF, the output voltage VOUT of the comparator 404 indicates a low-level, that is, 0V.

Figure 13:
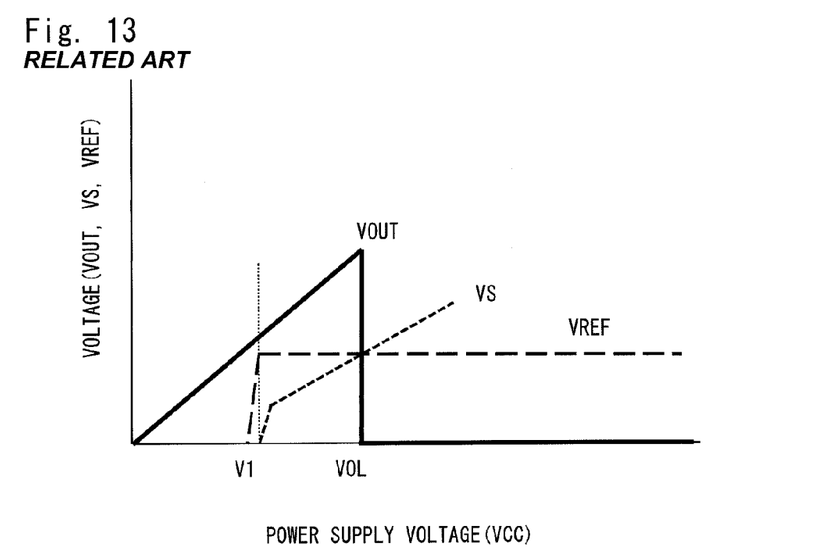
FIG. 13 illustrates an operation waveform of the power supply voltage detection circuit according to the related art.

FIG. 13 illustrates the relationship between the power supply voltage VCC, the output voltage VOUT, the reference voltage VREF, and the output voltage VS, in the circuit illustrated in FIG. 12. If the power supply voltage VCC is low (less than or equal to V1), the reference voltage VREF and the output voltage VS indicate a low voltage (about 0V). Therefore, the output voltage VOUT indicates a high-level (VCC). Next, if the power supply voltage VCC increases, the reference voltage VREF rises (is stabilized). The output voltage VS also increases along with that. However, if the power supply voltage VCC is less than or equal to the detection voltage VOL, it is VS<VREF. Then the output voltage VOUT indicates a high-level (VCC). Then, if the power supply voltage VCC further increases, the power supply voltage VCC exceeds the detection voltage VOL. At this time, it is VS>VREF. Then the output voltage VOUT indicates a low-level (0V).

As described so far, based on the detection voltage VOL of the power supply voltage VCC, the output voltage VOUT of the circuit illustrated in FIG. 12 switches from a high-level (VCC) to a low-level (0V). Then the circuit illustrated in FIG. 12 can detect a low voltage state of the power supply voltage VCC. Note that if the reference voltage VREF is not stabilized, the circuit illustrated in FIG. 12 maintains the output voltage OUT to be high-level, even if the power supply voltage VCC reaches the detection voltage VOL. In this way, the circuit illustrated in FIG. 12 detects a low voltage state of the power supply voltage VCC according to the state of not only the power supply voltage VCC but also the reference voltage VREF. This prevents from generating the problem of the circuit illustrated in FIG. 7.

SUMMARY

The circuit illustrated in FIG. 12 requires the comparator 404 for comparing the reference voltage VREF and the output voltage VS. Therefore, there is a problem of an increased circuit size. As illustrated in FIG. 13, in the range (less than or equal to V1) in which the power supply voltage VCC is low and the reference voltage VREF is not stabilized, both of the output voltage VS and the reference voltage VREF indicates a low voltage of about 0V. Therefore, an output of the comparator 404 is unstable. Further, the comparator 404 is driven by the reference voltage VREF. Accordingly, in the range (less than or equal to V1) in which the reference voltage VREF is not stabilized, the comparator 404 does not operate normally. That is, the output voltage VOUT of the comparator 404 is not stabilized. As described so far, the present inventor has found a problem that in the circuit illustrated in Japanese Unexamined Patent Application Publication No. 2005-278056 that the low voltage state of the power supply voltage VCC cannot be accurately detected.

As described above, there has been a problem in the power supply voltage detection circuit of related arts that the low voltage state of the power supply voltage cannot be accurately detected.

An exemplary aspect of the present invention is a power supply voltage detection circuit that includes a reference signal generation circuit (for example, a reference voltage source 100 in a first exemplary embodiment of the present invention) that generates a reference signal according to a power supply voltage, a first transistor (for example, a switch 101 in the first exemplary embodiment of the present invention) having a current flowing between a first terminal and a second terminal, where the current is controlled according to the reference signal, a voltage generation circuit (for example, a voltage generation circuit 102 in the first exemplary embodiment of the present invention) that generates a control voltage according to a potential difference between the power supply voltage and the first terminal of the first transistor, and a second transistor (for example, a switch 107 in the first exemplary embodiment of the present invention) that controls whether or not to output the power supply voltage according to the control voltage.

The power supply voltage detection circuit with the above structure can accurately detect an low voltage state of the power supply voltage.

The present invention provides a power supply voltage detection circuit that enables to accurately detect a low voltage state of the power supply voltage.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Specific exemplary embodiments incorporating the present invention are described in detail with reference to the drawings. The same components in the drawings are denoted by reference numerals, and for clarity of explanation, repeated explanation is omitted as appropriate.

First Exemplary Embodiment

Figure 1:
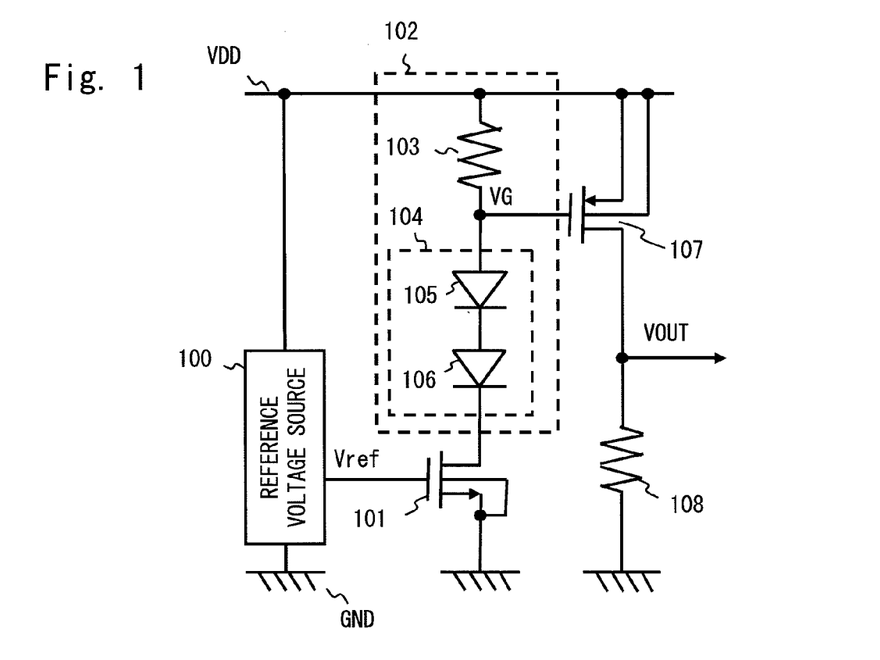
FIG. 1 is a circuit diagram illustrating a power supply voltage detection circuit according to a first exemplary embodiment of the present invention.

A first exemplary embodiment of the present invention is explained with reference to the drawings. FIG. 1 is a block diagram illustrating the power supply voltage detection circuit according to the first exemplary embodiment of the present invention. The circuit illustrated in FIG. 1 is provided with a reference voltage source (reference signal generation circuit) 100, a switch (a first transistor) 101, a voltage drop circuit 104, a switch (a second transistor) 107, a load device (a first resistor) 103, and load device 108. Note that the resistor 103 and the voltage drop circuit 104 constitute a voltage generation circuit 102. The diodes 105 and 106 constitute the voltage drop circuit 104. In this exemplary embodiment, a case is explained hereinafter in which the switch 101 is an N-channel MOS transistor, and the switch 107 is a P-channel MOS transistor. Further, an example in which the load devices 103 and 108 are resistors is explained.

The power supply voltage terminal VDD is connected to a high potential side power supply terminal of the reference voltage source 100, one terminal of the load device 103, and a source of the switch 107. A ground voltage terminal GND is connected to a low potential side power supply terminal of the reference voltage source 100, a source (a second terminal) of the switch 101, and one terminal of the load device 108. An output terminal of the reference voltage source 100 is connected to a gate of the switch 101. The other terminal of the load device 103 is connected to a gate of the switch 107, and an anode of the diode 105. A cathode of the diode 105 is connected to an anode of the diode 106. A cathode of the diode 106 is connected to a drain (a first terminal) of the switch 101. A drain of the switch 107 is connected to the other terminal of the load device 108, and an external output terminal. For convenience, the symbols "VDD" and "GND" indicate each terminal, and also the power supply voltage and the ground voltage, respectively.

Figure 2:
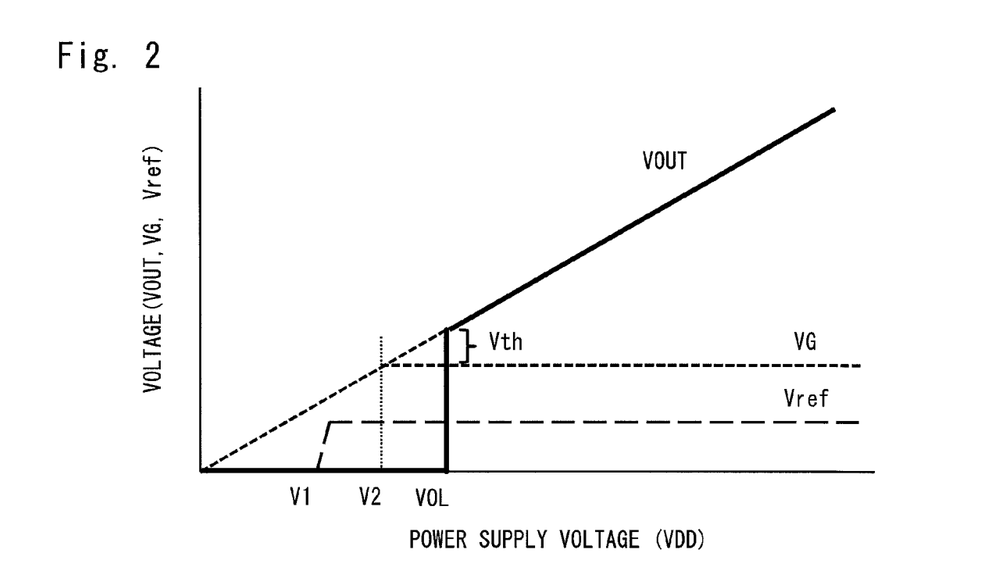
FIG. 2 illustrates an operation waveform of the power supply voltage detection circuit according to the first exemplary embodiment of the present invention.

Next, an operation is explained with reference to FIGS. 1 and 2. First, a case in which the power supply voltage VDD is low, for example at a power on, is explained. In this case, the reference voltage Vref output by the reference voltage source 100 is about 0V. Accordingly, both of the switches 101 and 107 are turned off. Then, as the voltage (output voltage VOUT) of the external output terminal is discharged to the ground voltage via the load device 108, the voltage indicates a low-level (0V).

Next, a case in which power supply voltage VDD increases to exceed V1 is explained. In this case, the reference voltage source 100 outputs the reference voltage Vref having a stable potential. The switch 101 is turned on at this time. However, a current will not flow from the power supply voltage terminal VDD to the load device 103 due to a resistance component of the voltage drop circuit 104. That is, the gate voltage VG of the switch 107 is the same voltage as the power supply voltage VDD. As a voltage between gate and source of the switch 107 is 0V, the switch 107 is turned off. Then the output voltage VOUT indicates a low-level (0V).

A case in which the power supply voltage VDD further increases to exceed the drop voltage V2 of the voltage drop circuit 104 is explained hereinafter. In this case, a gate voltage VG of the switch 107 indicates a predetermined potential. Then, if a potential difference between the gate voltage VG of the switch 107 and the power supply voltage VDD exceeds the threshold voltage Vth of the switch 107, the switch 107 is turned on. Accordingly, the external output terminal is supplied with the power supply voltage VDD via the source and the drain of the switch 107, thus the supply voltage VDD indicates a high-level.

That is, it is possible to determine whether the power supply voltage VDD reached the detection voltage VOL or not by a voltage state (low or high-level) of the output voltage VOUT of the circuit illustrated in FIG. 1. Further, if the reference voltage Vref is not stabilized, the circuit illustrated in FIG. 1 maintains the output voltage OUT to be low-level, even if the power supply voltage VDD reached the detection voltage VOL. The threshold voltage of the switch 107 shall be Vth. The drop voltage of the voltage drop circuit 104 shall be V2. At this time, by VOL−V2=Vth, it can be expressed as VOL=Vth+V2. That is, the circuit illustrated in FIG. 1 can adjust the detection voltage VOL by the threshold voltage Vth and the drop voltage V2. Although in FIG. 1, an example is explained in which the voltage drop circuit 104 includes the diodes 105 and 106, and two of the forward voltage of the diodes (approximately 0.7V×2=approximately 1.4V) is a drop voltage V2. However it is not limited to this. In order to adjust the detection voltage VOL, the number of diodes can be changed as appropriate.

Next, an operation of an actual electronic circuit incorporating the power supply voltage detection circuit according to the first exemplary embodiment of the present invention is explained. In the photocurrent-to-voltage conversion circuit illustrated in FIG. 10, the operation when using the power supply voltage detection circuit of FIG. 1 instead of the power supply voltage detection circuit 303 is explained with reference to FIG. 3. Note that the reference voltage source 302 shall be the reference voltage source 100.

As with the case of FIGS. 11A and 11B, FIGS. 3A and 3B illustrate the operation of the photocurrent-to-voltage conversion circuit in case the power supply voltage VDD rises relatively quickly at a power on. As the power supply voltage VDD rises relatively quickly, the reference voltage Vref rises after the power supply voltage VDD reaches the detection voltage VOL. Note that the horizontal axis indicates time passed since the power on. The vertical axis indicates the voltage.

Figure 3A:
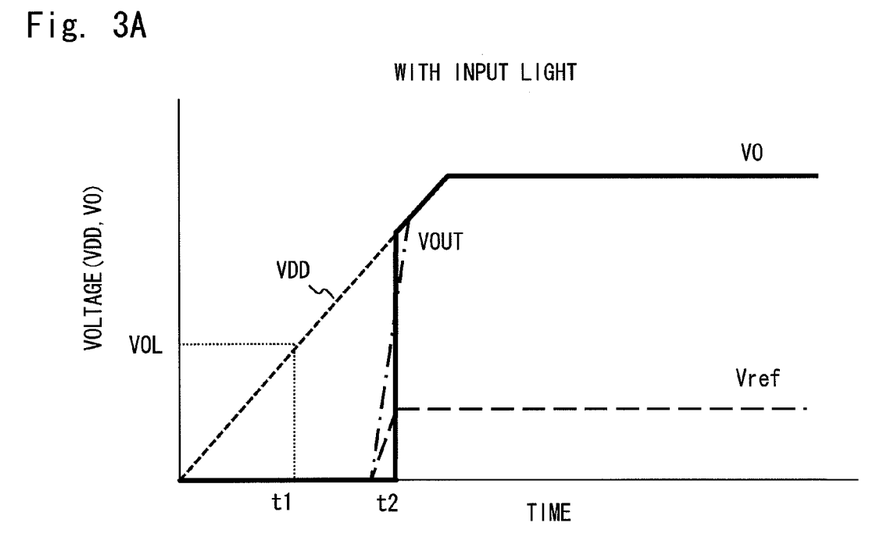
FIG. 3A illustrates an operation waveform of the power supply voltage detection circuit according to the first exemplary embodiment of the present invention.

FIG. 3A illustrates an example in which light is input to the photodiode 300. If the power supply voltage VDD is less than or equal to the detection voltage VOL, the output voltage VOUT of the power supply voltage detection circuit indicates a low-level. Then, the output voltage V0 of the photocurrent-to-voltage conversion circuit also indicates a low-level.

Next, when the power supply voltage VDD reached the detection voltage VOL (t1), the reference voltage Vref has not risen yet. Therefore, the output voltage VOUT of the power supply voltage detection circuit indicates a low-level. Thus, the output voltage V0 of the photocurrent-to-voltage conversion circuit also indicates a low-level. Then, if the reference voltage Vref rises (t2), the output voltage VOUT of the power supply voltage detection circuit switches from a low-level to a high-level (VDD). At this time, as there is the input light, the output voltage V0 of the photocurrent-to-voltage conversion circuit indicates a high-level.

Figure 3B:
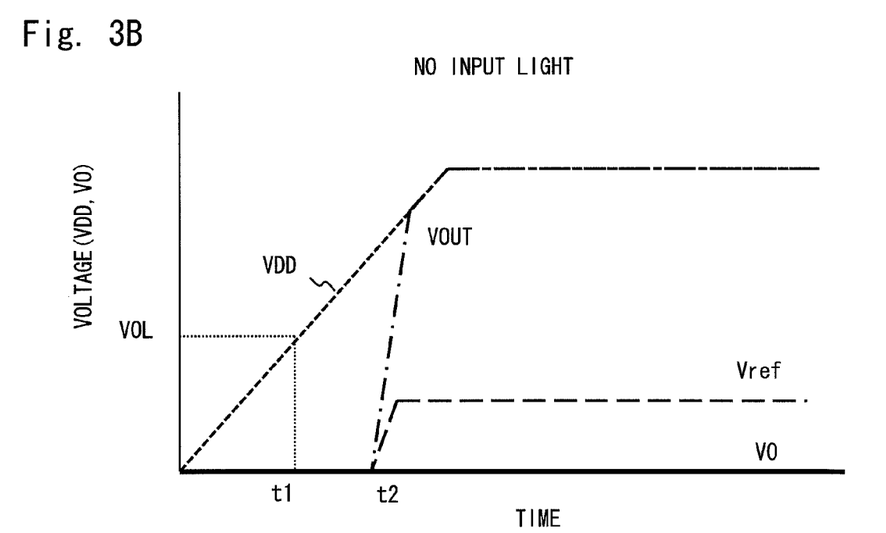
FIG. 3B illustrates an operation waveform of the power supply voltage detection circuit according to the first exemplary embodiment of the present invention.

FIG. 3B illustrates an example in which there is no light input to the photodiode 300. As with the case of FIG. 3A, the output voltage VOUT of the power supply voltage detection circuit indicates a low-level until the reference voltage Vref rises (t2). Therefore, the output voltage V0 of the photocurrent-to-voltage conversion circuit also indicates a low-level.

Then, the output voltage VOUT of the power supply voltage detection circuit indicates a high-level (VDD) after the rise of the reference voltage Vref (t2). At this time, as there is no input light, the output signal of the I/V converter 301 indicates a low-level. That is, the output voltage V0 of the photocurrent-to-voltage conversion circuit indicates a low-level (0V). As described so far, the photocurrent-to-voltage conversion circuit illustrated in FIG. 10 is not influenced by the unstable operation of the reference voltage source 100, but can operate normally.

Thus, unlike related arts, the power supply voltage detection circuit according to the first exemplary embodiment does not create a chattering or the like in the period (t1-t2) from when the power supply voltage VDD reached the detection voltage VOL until the reference voltage Vref rises. This realizes an ideal protection of the electronic circuit. That is, the power supply voltage detection circuit according to the first exemplary embodiment of the present invention can supply the stable power supply voltage.

The power supply voltage detection circuit according to the first exemplary embodiment detects the low voltage state of the power supply voltage VDD by on and off of the switch 107. In order for the switch 107 to turn on, a potential difference between the voltage VG, which is determined by the voltage drop circuit 104 and the load device 103, and power supply voltage VDD needs to be more than or equal to the threshold voltage of the switch 107. Therefore, the switch 101 must be turned on when the reference voltage Vref rises.

Such circuit configuration of the power supply voltage detection circuit according to the first exemplary embodiment of the present invention does not require the comparator as in the circuit of a related art. This enables to suppress from increasing the circuit size. Further, unlike the comparator used in a circuit of a related art, the load device 103 and the voltage drop circuit 104 or the like are not required to be driven by the reference voltage (or reference current). Therefore, the power supply voltage detection circuit according to the first exemplary embodiment of the present invention can accurately detect the low voltage state of the power supply voltage even if the reference voltage is not operating or in an unstable operation. That is, a stable power supply voltage can be supplied to a subsequent stage electronic circuit.

Second Exemplary Embodiment

FIG. 1 explains the power supply voltage detection circuit using the reference voltage source 100. On the other hand, FIG. 2 explains a power supply voltage detection circuit using a reference current source 109 instead of the reference voltage source 100. The case of FIG. 2 is used when a subsequent stage electronic circuit does not include a reference voltage source, for example.

Figure 4:
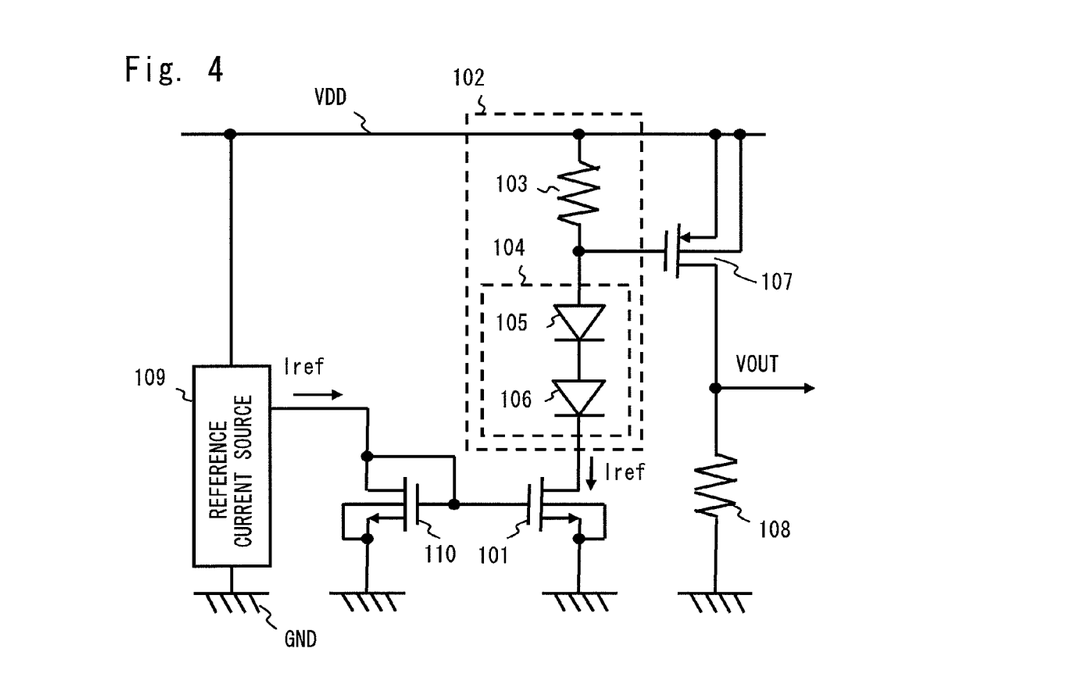
FIG. 4 is a circuit diagram illustrating a power supply voltage detection circuit according to a second exemplary embodiment of the present invention.

As compared with the circuit illustrated in FIG. 1, the circuit illustrated in FIG. 4 is provided with the reference current source 109 instead of the reference voltage source 100, and is further provided with a switch (a second transistor) 110. Note that this exemplary embodiment explains an example in which the switches 101 and 110 are N-channel MOS transistors, and the switch 107 is a P-channel MOS transistor to an example. Further, an example in which the load devices 103 and 108 are resistors is explained. In the following explanation, the switch 101 is referred to as a transistor 101 for convenience. The switch 110 is referred to as a transistor 110.

A high potential side power supply terminal of the reference current source 109 is connected to the source voltage terminal VDD. A low voltage side power supply terminal of the reference current source 109 is connected to the ground voltage terminal GND. An output terminal of the reference current source 109 is connected to a drain and a gate of the transistor 110, and a gate of the transistor 110. That is, the transistors 110 and 101 constitute a current mirror circuit. A source of the transistor 110 is connected to the ground voltage terminal GND. Note that a current (for example, Iref) which flows between a source and a drain of the transistor 101 is controlled according to a constant current Iref output from the reference current source 109. Other circuit configuration and the operation are same as in FIG. 1, thus the explanation is omitted.

The reference voltage source usually generates a constant voltage according to a reference current source, such as a band gap reference (BGR). However, many circuits including an operational amplifier can actually operate only by the reference current source. The power supply voltage detection circuit according to the second exemplary embodiment can detect the low voltage state of the power supply voltage VDD, even if the subsequent stage electronic circuit does not include the reference voltage source. Further, the power supply voltage detection circuit according to the second exemplary embodiment can realize a power supply voltage detection circuit using a reference current source having a circuit size smaller than the reference voltage source. This realizes to miniaturize the circuit and also reduce the cost of the circuit.

Third Exemplary Embodiment

In the circuit configuration of FIGS. 1 and 4, a case is explained in which the voltage drop circuit 104 is provided with the diodes 105 and 106, and the voltage is reduced by the forward direction voltage of the diode. However, in this case, the voltage drop can only be specified to an integral multiple of the forward voltage (usually approximately 0.7V) of the diode. Therefore, it is difficult to finely adjust the detection voltage VOL of the power supply voltage detection circuit. Further, as the forward voltage of the diode largely changes by temperature or the like, there is a problem that the detection voltage VOL also largely changes by temperature or the like.

Figure 5:
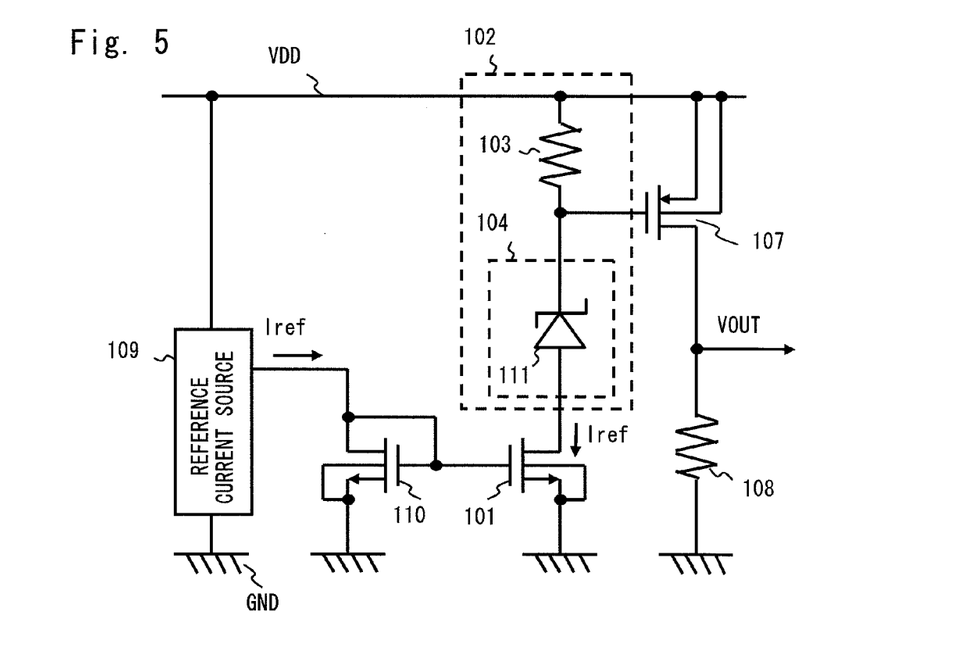
FIG. 5 is a circuit diagram illustrating a power supply voltage detection circuit according to a third exemplary embodiment of the present invention.
Figure 6:
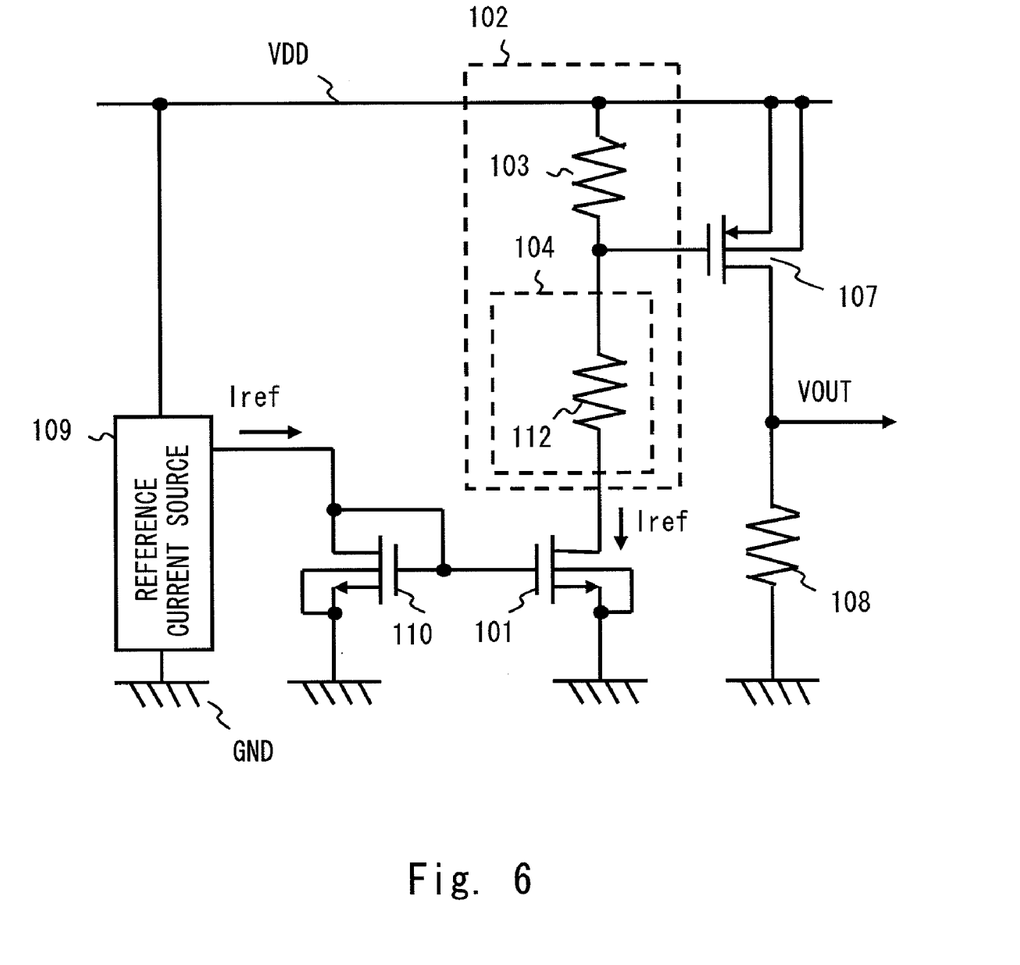
FIG. 6 is a circuit diagram illustrating the power supply voltage detection circuit according to the third exemplary embodiment of the present invention.

As a method to improve the above problems, instead of the diodes 105 and 106, the Zener diode 111 as in FIG. 5 or the resistor (the second resistor) 112 as in FIG. 6 may be provided to the voltage drop circuit 104. As in the circuit illustrated in FIG. 5, if the voltage drop circuit 104 is provided with the Zener diode 111, the voltage fluctuation by temperature is small. Moreover, the Zener voltage can be specified according to the diffusion condition or the like.

As in the circuit illustrated in FIG. 6, if the voltage drop circuit 104 is provided with the resistor 112, the drop voltage can be freely specified according to the resistance value and the constant current Iref.

As described above, the power supply voltage detection circuit according to the abovementioned exemplary embodiment includes the switch 101, which is controlled to be on and off by the reference voltage (or the reference current), the voltage drop circuit 104, and the load device 103 that are connected in series. Then, the switch 107 is controlled to be on and off by the voltage generated by the series circuit. Therefore, the comparator as the circuit of the related art is not required. This enables to suppress from increasing the circuit size. Unlike the comparator that has been used in the circuit of a related art, the load device 103 and the voltage drop circuit 104 or the like do not need to be driven by the reference voltage (or the reference current). Accordingly, the power supply voltage detection circuit according to the abovementioned exemplary embodiment can accurately detect the low voltage state of the power supply voltage, if the reference voltage (or the reference current) is not operating, or in an unstable operation. That is, a stable power supply voltage can be supplied to a subsequent stage electronic circuit.

The power supply voltage detection circuit according to the abovementioned exemplary embodiment is characterized in that the low voltage state of the power supply voltage can be detected after the reference voltage source (or reference current source) started a normal operation. This resolves a malfunction problem caused by a delayed operation of the reference voltage source (or the reference current source).

Also in the case of a related art, the low voltage state of the power supply voltage can be detected after the reference voltage source starts a normal operation. However, the power supply voltage detection circuits according to the abovementioned exemplary embodiments do not require the comparator that has been necessary in a related art. This realizes to miniaturize the circuit. Further, the power supply voltage detection circuit according to the abovementioned exemplary embodiments do not create a chattering or the like in the period from the power supply voltage reached the detection voltage VOL until the reference voltage is stabilized.

Note that the present invention is not limited to the above exemplary embodiments, but can be modified as appropriate in the scope of the present invention. For example, in the abovementioned exemplary embodiment, an example in which the switches 101 and 110 are N-channel MOS transistors is explained, however it is not limited to this. For example, the switches 101 and 110 can be changed to NPN bipolar transistors as appropriate.

The first to the third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A power supply voltage detection circuit comprising:
a reference signal generation circuit that generates a reference signal according to a power supply voltage;
a first transistor having a current flowing between a first terminal and a second terminal, the current being controlled according to the reference signal;
a voltage generation circuit that generates a control voltage according to a potential difference between the power supply voltage and the first terminal of the first transistor, the voltage generation circuit being connected in series with the first transistor; and
a second transistor that controls whether or not to output the power supply voltage according to the control voltage,
wherein the reference signal generation circuit comprises:
a reference current generation circuit that generates a reference current according to the power supply voltage and outputs the reference current as the reference signal; and
a current mirror circuit that includes the first transistor and passes a current corresponding to the reference signal, between the first terminal and the second terminal of the first transistor.

2. The power supply voltage detection circuit according to claim 1, wherein the current mirror circuit comprises:
the first transistor; and
a third transistor that is connected in a current mirror configuration with the first transistor.

3. The power supply voltage detection circuit according to claim 2, wherein the first transistor and the third transistor are N-channel MOS transistors.

4. The power supply voltage detection circuit according to claim 2, wherein the first transistor and the third transistor are NPN bipolar transistors.

5. The power supply voltage detection circuit according to claim 1, wherein the voltage generation circuit comprises:
a first resistor; and
a voltage drop circuit that is connected in series with the first resistor,
wherein a node for connecting the first resistor and the voltage drop circuit generates the control voltage.

6. The power supply voltage detection circuit according to claim 5, wherein the voltage drop circuit is a diode.

7. The power supply voltage detection circuit according to claim 5, wherein the voltage drop circuit is a second resistor.

8. The power supply voltage detection circuit according to claim 5, wherein the voltage drop circuit is a Zener diode.

9. The power supply voltage detection circuit according to claim 1, wherein the second transistor is a P-channel MOS transistor.

* * * * *